US012112912B2

(12) United States Patent
Hoshiba et al.

(10) Patent No.: US 12,112,912 B2
(45) Date of Patent: Oct. 8, 2024

(54) SAFETY SWITCH AND APPARATUS WITH DOOR

(71) Applicant: PANASONIC INTELLECTUAL PROPERTY MANAGEMENT CO., LTD., Osaka (JP)

(72) Inventors: Takashi Hoshiba, Aichi (JP); Ayano Minami, Aichi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 156 days.

(21) Appl. No.: 17/756,054

(22) PCT Filed: Nov. 24, 2020

(86) PCT No.: PCT/JP2020/043554
§ 371 (c)(1),
(2) Date: May 16, 2022

(87) PCT Pub. No.: WO2021/149344
PCT Pub. Date: Jul. 29, 2021

(65) Prior Publication Data
US 2022/0406535 A1 Dec. 22, 2022

(30) Foreign Application Priority Data
Jan. 24, 2020 (JP) .................. 2020-010407

(51) Int. Cl.
*H01H 9/02* (2006.01)
*G01V 8/10* (2006.01)
(Continued)

(52) U.S. Cl.
CPC ................. *H01H 9/02* (2013.01); *G01V 8/10* (2013.01); *H01H 3/161* (2013.01); *H01H 9/16* (2013.01);
(Continued)

(58) Field of Classification Search
CPC .... G09F 13/20; H01H 2009/164; H01H 3/16; H01H 3/161; H01H 9/02; H01H 9/16;
(Continued)

(56) References Cited

U.S. PATENT DOCUMENTS

2014/0347190 A1  11/2014  Grimm
2019/0244489 A1   8/2019  Su et al.

FOREIGN PATENT DOCUMENTS

JP    S47-007741 U    9/1972
JP    2019-139877 A   8/2019

OTHER PUBLICATIONS

Extended European Search Report dated May 17, 2023 issued in Patent Application No. EP 20 91 4886.5.
(Continued)

*Primary Examiner* — Anthony R Jimenez
(74) *Attorney, Agent, or Firm* — Pearne & Gordon LLP

(57) ABSTRACT

A safety switch includes a detection unit, an output unit, an input unit; and a display unit. The detection unit is configured to detect presence or absence of abnormality. The output unit is configured to output an abnormality detection signal indicating a detection result of the presence or absence of the abnormality. The input unit is configured to input a display control signal. The display unit is configured to perform display based on the display control signal.

12 Claims, 13 Drawing Sheets

(51) Int. Cl.
    *G09F 13/20*     (2006.01)
    *H01H 3/16*     (2006.01)
    *H01H 9/16*     (2006.01)

(52) U.S. Cl.
    CPC ....... *G09F 13/20* (2013.01); *H01H 2009/164* (2013.01)

(58) Field of Classification Search
    CPC ................ H01H 9/0264; H01H 9/161; H01H 2215/044; H01H 13/18; H01H 13/183; H01H 13/186; H01H 2219/014; H01H 2219/036; H01H 2219/039; H01H 2219/046; H01H 2219/054; H01H 2219/062; G01V 8/10; A47L 15/4236; F24C 15/022; F24C 14/00; D06F 37/42; E05F 15/0004; H05B 6/76
    USPC ...................................................... 200/237
    See application file for complete search history.

(56) References Cited

OTHER PUBLICATIONS

International Search Report dated Feb. 2, 2021 issued in Patent Application No. PCT/JP2020/043554.
Written Opinion dated Feb. 2, 2021 issued in Patent Application No. PCT/JP2020/043554.

SAFETY SWITCH AND APPARATUS WITH DOOR

TECHNICAL FIELD

The present disclosure relates to a safety switch and an apparatus with a door.

BACKGROUND ART

In the related art, there has been known a safety switch that is attached to a front door of a machine tool, a door portion of a safety fence around an industrial robot, or the like, and detects opening and closing of the door. In this safety switch, a dedicated actuator attached to the door (movable side) approaches a sensor main body by closing the door, and transmits a signal when a detection element in the main body detects the approaching. In the related art, it is known that in a safety switch including a sensor main body and an actuator, the sensor main body includes a display unit that detects opening and closing of a door and displays an opening and closed state of the door (see Patent Literature 1).

CITATION LIST

Patent Literature

Patent Literature 1: JP-A-2019-139877

SUMMARY OF INVENTION

Technical Problem

The safety switch in the related art has a room for improvement in display of a detection result (for example, the opening and closed state of the door) of abnormality detected by the safety switch.

The present disclosure provides a safety switch and an apparatus with a door capable of improving visibility of a display of a detection result of abnormality detected by the safety switch.

Solution to Problem

An aspect of the present disclosure is a safety switch including a sensor main body and an actuator, the sensor main body includes a detection unit configured to detect the actuator when the actuator is disposed at a predetermined position with respect to the sensor main body, and a light projection unit configured to project light in accordance with a detection result of the detection unit, and the actuator includes a light emitting unit configured to emit visible light in response to reception of the light projected by the light projection unit.

An aspect of the present disclosure is an apparatus with a door including the safety switch described above and a door, the door includes a fixed frame, a movable frame, and a door main body, the sensor main body of the safety switch is provided on the fixed frame, and the actuator of the safety switch is provided on the movable frame.

Advantageous Effects of Invention

According to the present disclosure, the visibility of the display of the detection result of the abnormality detected by the safety switch can be improved.

DESCRIPTION OF EMBODIMENTS

Hereinafter, an embodiment will be described in detail with reference to the drawings as appropriate. However, an unnecessary detailed description may be omitted. For example, detailed description of a well-known matter or repeated description of substantially the same configuration may be omitted. This is to avoid unnecessary redundancy in the following description and to facilitate understanding of those skilled in the art. The attached diagrams and the following description are provided for those skilled in the art to sufficiently understand the present disclosure, and are not intended to limit the matters described in the scope of the claims.

Introduction to Contents of Embodiment

A sensor main body and an actuator of a safety switch are attached to a frame (for example, an aluminum frame) of a door. At this time, the sensor main body and the actuator are generally attached to a rear surface side of the frame of the door. This is because, when the sensor main body and the actuator are attached to a front surface side, an object collides with the sensor main body and the actuator and is damaged, a person comes into contact with the sensor main body and the actuator and is injured, or an appearance around the safety switch is deteriorated. Further, a display unit of the sensor main body attached to the rear surface side of the frame of the door is difficult to be checked from an outside of the door, and visibility is insufficient. Specifically, when viewed from a front of the door, the display unit is blocked by the frame of the door and it is difficult to be checked, and even when viewed from a position other than the front of the door, it is difficult to visually recognize the display unit from an angular range blocked by the frame, and a visible range is limited.

Hereinafter, a safety switch and an apparatus with a door that can improve visibility of display of a detection result of an abnormality will be described.

Embodiment

Figure 1:
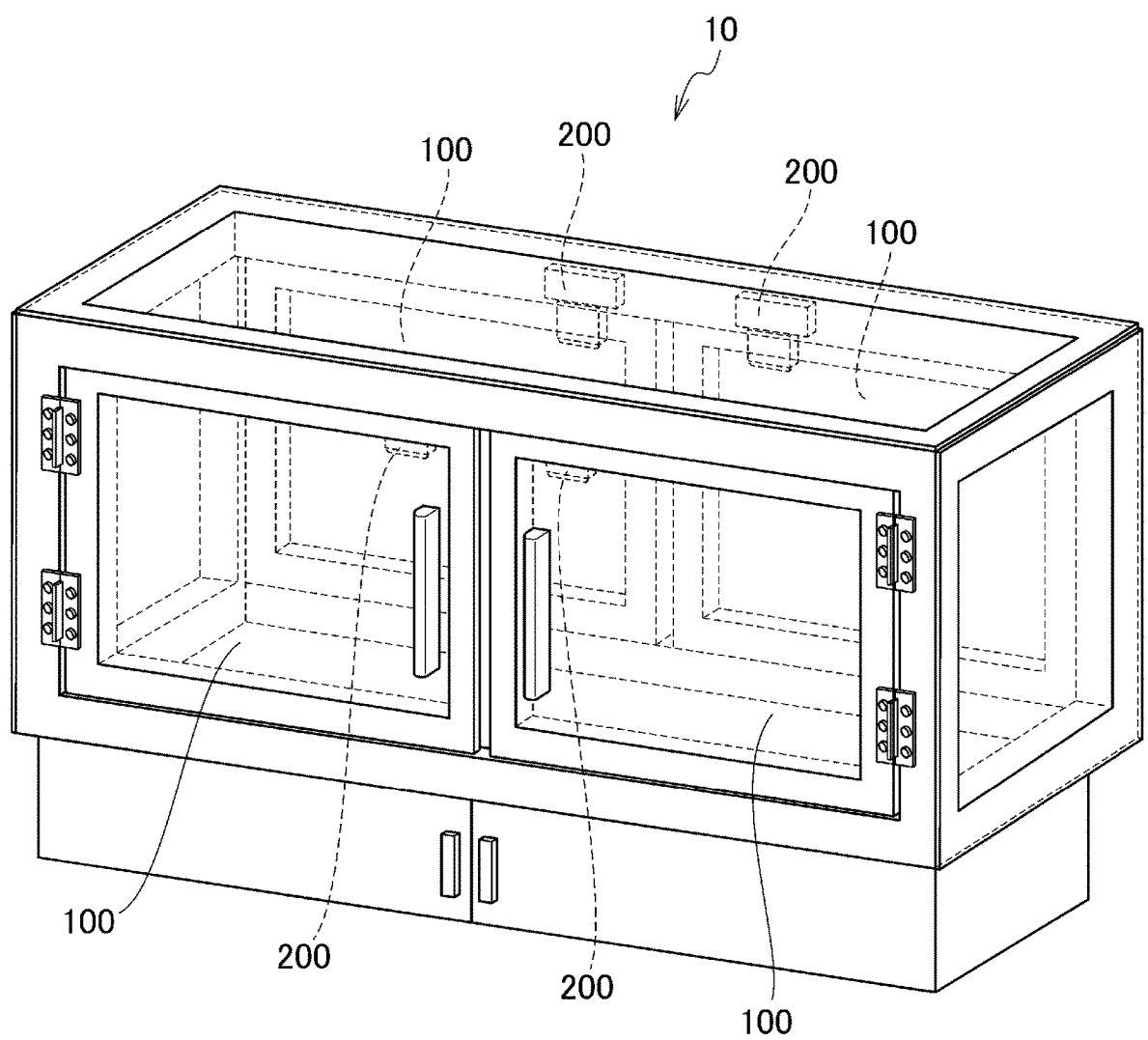
FIG. 1 is a diagram showing a configuration example of an apparatus with a door.

FIG. 1 is a diagram showing a configuration example of a door-equipped apparatus 10 according to an embodiment. The door-equipped apparatus 10 includes one or more doors 100 and one or more safety switches 200. The door 100 may widely include those related to a door such as an opening and a gate, and may include a window. The door-equipped apparatus 10 is, for example, a manufacturing apparatus, and, for example, a manufacturing apparatus main body is accommodated inside the door-equipped apparatus 10.

Figure 2:
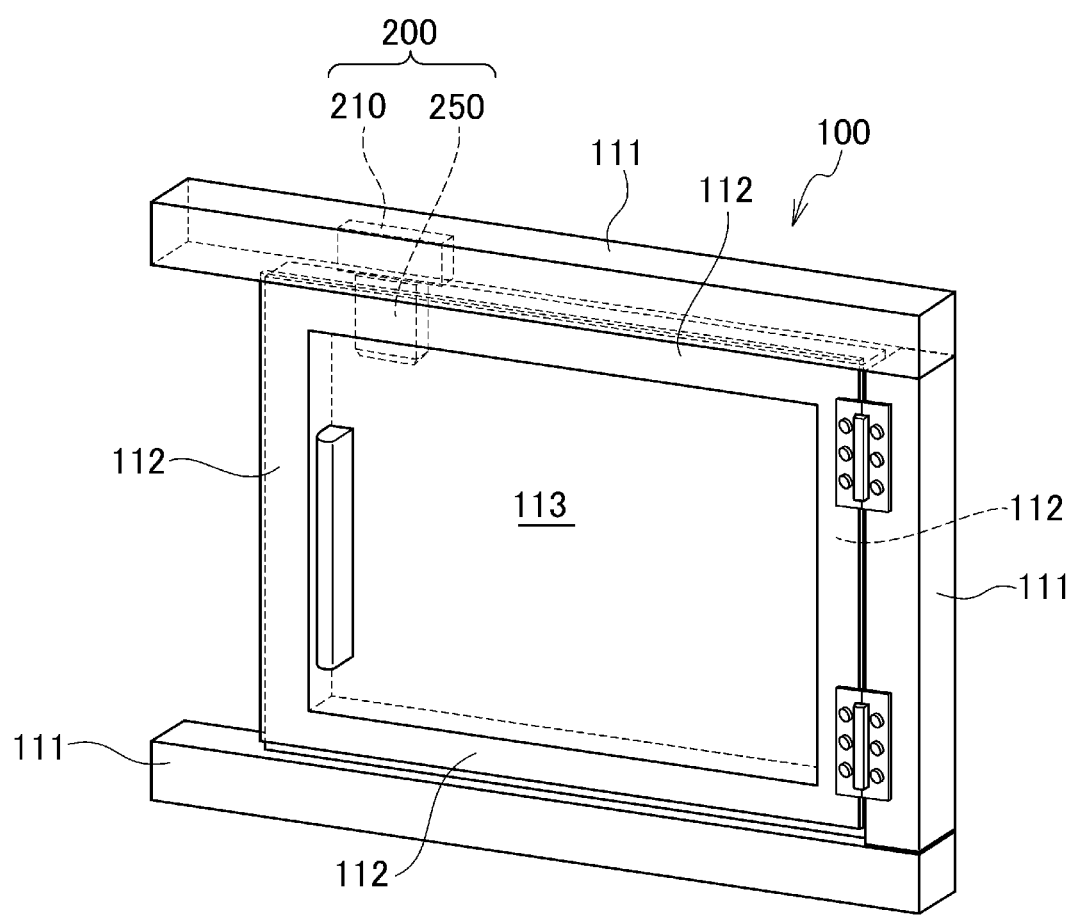
FIG. 2 is a perspective view showing a configuration example of the door.

FIG. 2 is a perspective view showing a configuration example of the door 100. Each of the doors 100 includes a fixed frame 111, a movable frame 112, and a door main body 113.

The fixed frame 111 is connected to a member (a housing or the like) that covers an outer periphery of the door-equipped apparatus 10. The fixed frame 111 is, for example, an aluminum frame, and may be a frame formed of the other materials. The fixed frame 111 does not have translucency.

The movable frame 112 is movable with respect to the fixed frame 111. As a result, the door 100 can be opened and closed. The movable frame 112 is, for example, an aluminum frame, and may be a frame formed of the other materials. The movable frame 112 does not have the translucency.

In the door main body 113, periphery of the door main body 113 is surrounded by the movable frame 112. The door main body 113 is formed of, for example, a light transmissive member. The light transmissive member may be formed of, for example, transparent plastic or glass, and the same applies to the following description of the light transmissive member.

It should be noted that a method of opening and closing the door 100 may include a hinged door method, a sliding door method, a folding door method, a bellows method, a double door method, a gull wing method, and the like.

A safety switch 200 functions as a door sensor that detects an opening and closed state of the door 100. The safety switch 200 includes a sensor main body 210 and an actuator 250. The sensor main body 210 is provided on the fixed frame 111 inside the door-equipped apparatus 10. The actuator 250 is provided on the movable frame 112 inside the door-equipped apparatus 10. Therefore, when viewed from a checker who checks from the outside of the door-equipped apparatus 10, the safety switch 200 is located on the rear surface side of the fixed frame 111 and the movable frame 112.

The sensor main body 210 detects a state (for example, the opening and closed state) of the door, and projects light based on a detection result. For example, the sensor main body 210 projects the detection result to the actuator 250. The actuator 250 receives the projected light and emits visible light based on the light. The light emitted from the actuator 250 can be visually recognized from the outside of the door-equipped apparatus 10 through the door main body 113 formed of the light transmissive member.

Figure 3:
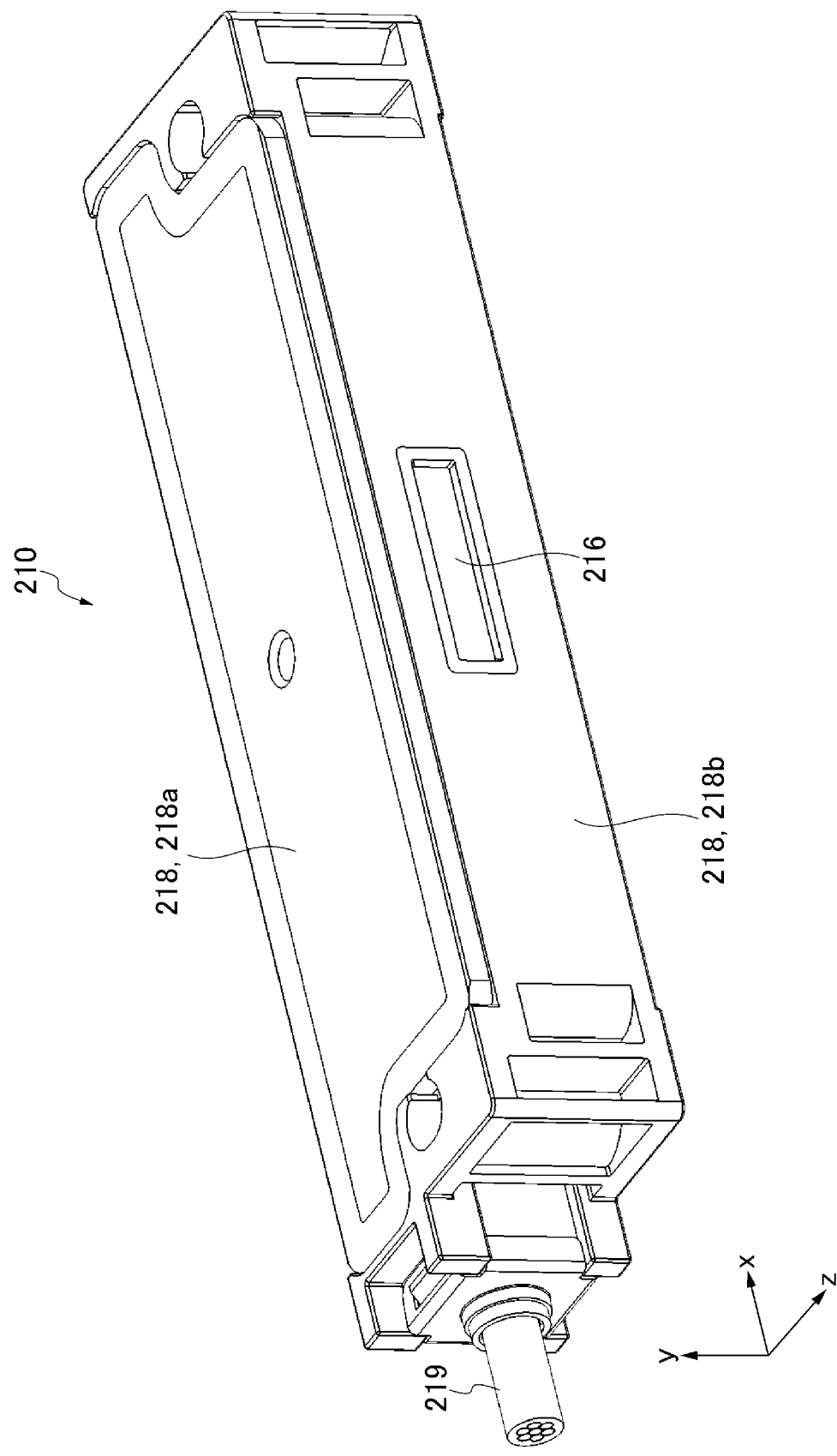
FIG. 3 is a front perspective view showing an example of a sensor main body of a safety switch.
Figure 4:
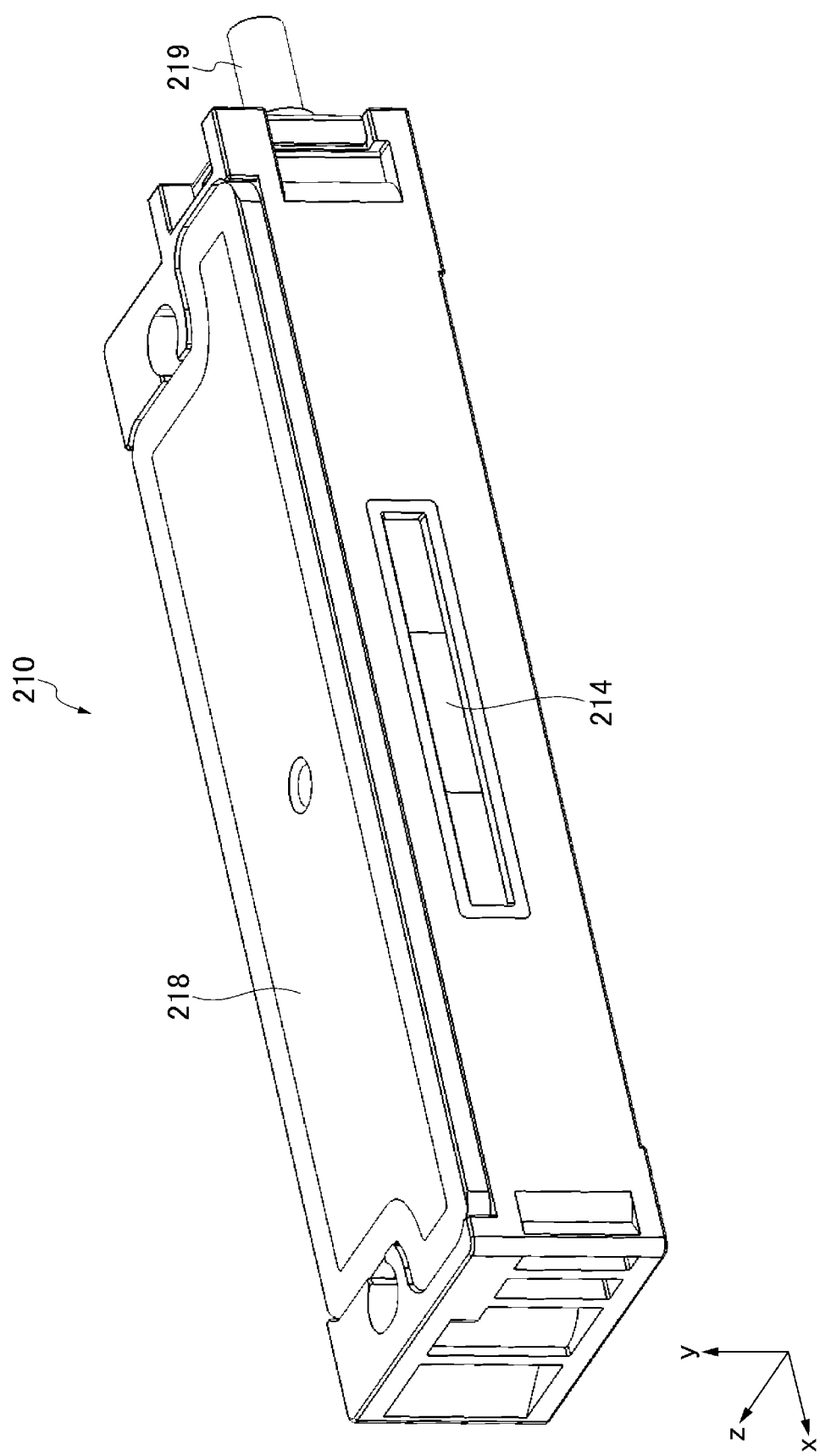
FIG. 4 is a rear perspective view showing an example of the sensor main body.
Figure 5:
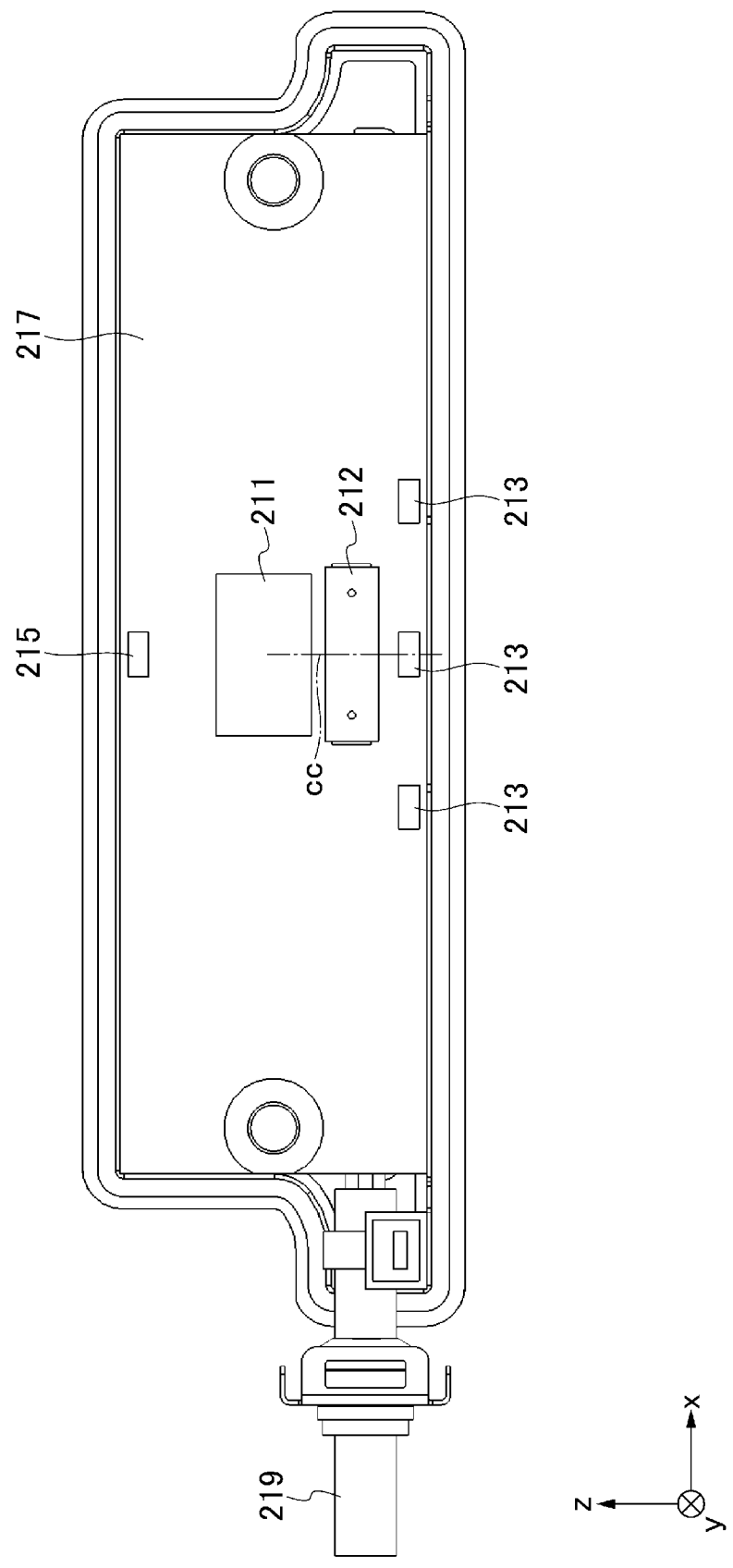
FIG. 5 is a diagram showing an example of a substrate on which electronic components are mounted in the sensor main body.

FIG. 3 is a front perspective view (perspective view seen from a positive side in a z direction) showing an example of the sensor main body 210. FIG. 4 is a rear perspective view (perspective view seen from a negative side in the z direction) showing an example of the sensor main body 210. FIG. 5 is a diagram showing an example of a substrate on which electronic components are mounted in the sensor main body 210.

It should be noted that in the drawings, an x direction, a y direction, and the z direction are shown as necessary. In the present embodiment, the z direction is an arrangement direction of the sensor main body 210 and the actuator 250. The sensor main body 210 is located on the positive side in the z direction, and the actuator 250 is located on the negative side in the z direction. The y direction is an arrangement direction of the fixed frame 111 and the sensor main body 210 or an arrangement direction of the movable frame 112 and the actuator 250. The x direction is, for example, an extending direction of the fixed frame 111 in which the sensor main body 210 is provided, or an extending direction of the movable frame 112 in which the actuator 250 is provided.

The sensor main body 210 includes a processor 211, a coil 212, the first light sources 213, a first light projection port 214, a second light source 215, a second light projection port 216, a substrate 217, a housing 218, and a cable 219. The housing 218 includes a cover 218a and a case 218b, and accommodates the substrate 217. The electronic components included in the sensor main body 210 are mounted on the substrate 217. The electronic component may include the processor 211, the coil 212, the first light sources 213, and the second light source 215.

The processor 211 implements various functions in cooperation with a memory included in the sensor main body 210. The processor 211 may include a micro processing unit (MPU), a central processing unit (CPU), a digital processor (DSP), and the like. The processor 211 controls an overall operation of the sensor main body 210.

The coil 212 receives power from the outside via the cable 219, and transmits the power to an external device by wireless power transmission. The wireless power transmission may be, for example, an electromagnetic induction system or a magnetic field resonance system. Upon receiving a predetermined signal from the external device, the coil 212 notifies the processor 211 that the predetermined signal is received. The external device is, for example, the actuator 250, more specifically, an RFID tag 280 (to be described later) of the actuator 250. The coil 212 detects the closed state (an example of absence of abnormality) by receiving the predetermined signal, and detects the opening state (an example of presence of abnormality) by not receiving the predetermined signal.

The first light sources 213 operate as display lamps that display a detection result of abnormality of the door 100 detected by the safety switch 200. There may be one or more first light sources 213, and three first light sources 213 are provided in FIG. 5. The first light sources 213 project light (display) according to whether the predetermined signal is received from the actuator 250 under the control of the processor 211. The first light sources 213 can display in various display modes. The display mode may be a display color, a display pattern, light intensity, or the like.

The plurality of first light sources 213 may be arranged at symmetrical positions with respect to an arrangement position of the coil 212. For example, in FIG. 5, the three first light sources 213 are arranged line-symmetrically with respect to a center line cc of the coil 212 along the z direction. Accordingly, the sensor main body 210 can transmit the light from first light sources 213 symmetrically (for example, line-symmetrically) with respect to the position of coil 212 as a reference position. Therefore, the light of the actuator 250 based on the light of the sensor main body 210 is also light having symmetry with respect to the reference position. Further, since the plurality of first light sources 213 are disposed along a longitudinal direction of a facing surface facing the actuator, it is possible to expand a region of light of a light projection source from which the light is projected to the actuator 250. Therefore, the visibility of the safety switch 200 is improved.

The light of the first light sources 213 is projected by, for example, being transmitted through the first light projection port 214. The first light projection port 214 is formed of a light transmissive member. A light projection direction of the first light projection port 214 is a direction in which the actuator 250 attached to the door 100 is present when the door 100 is in the closed state. It should be noted that the first light projection port 214 may be formed of a mirror body, a reflective cylinder, or the like instead of the light transmissive member.

The second light source 215 operates as the display lamp that displays a detection result of abnormality of the door 100 detected by the safety switch 200. There may be one or more second light sources 215, and one second light source 215 is provided in FIG. 5. The second light source 215 projects light (displays) according to whether the predetermined signal is received from the actuator 250 under the control of the processor 211. The second light source 215 can display in various display modes.

The light of the second light source 215 is projected by, for example, being transmitted through the second light projection port 216. The second light projection port 216 is formed of a light transmissive member. A light projection direction of the second light projection port 216 is a direction different from the direction in which the actuator 250 attached to the door 100 is present when the door 100 is in the closed state, and is, for example, a direction opposite to the direction in which the actuator 250 is present. It should be noted that the second light projection port 216 may be formed of a mirror body, a reflective cylinder, or the like instead of the light transmissive member.

Various wirings such as a power supply line and a signal line are stored in the cable 219. The signal line may include, for example, a signal line through which the detection result of abnormality by another safety switch 200 is transmitted. The cable 219 supplies power to at least a part of the electronic components on the substrate 217. Therefore, in the actuator 250 provided in the movable portion, power supply for generating the light is not necessary, and a state in which the movable portion is easily moved can be maintained. It should be noted that illustration of an electrical wiring from the cable 219 to each of the electronic components is omitted.

Figure 6:
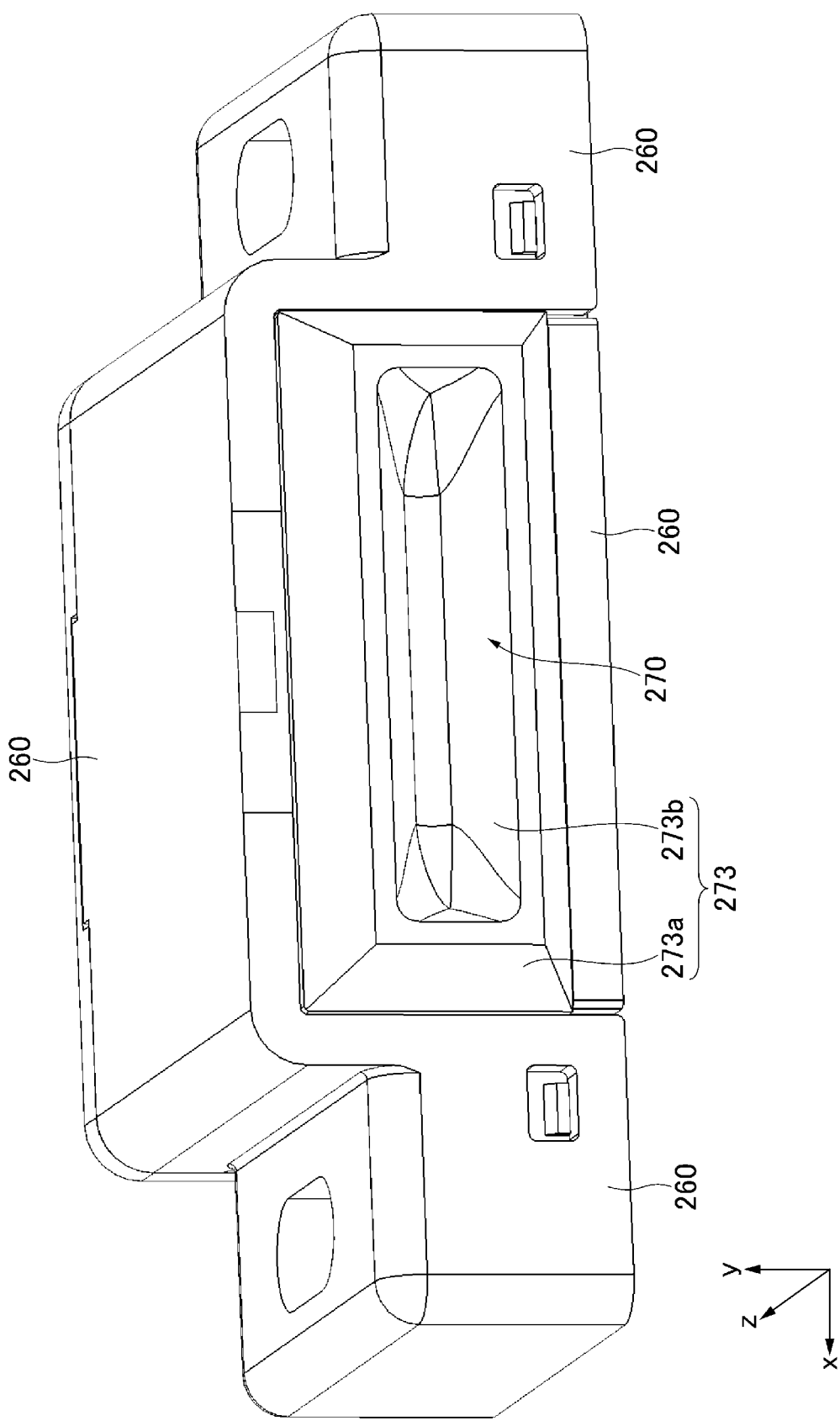
FIG. 6 is a front perspective view showing an example of an actuator of the safety switch.
Figure 7:
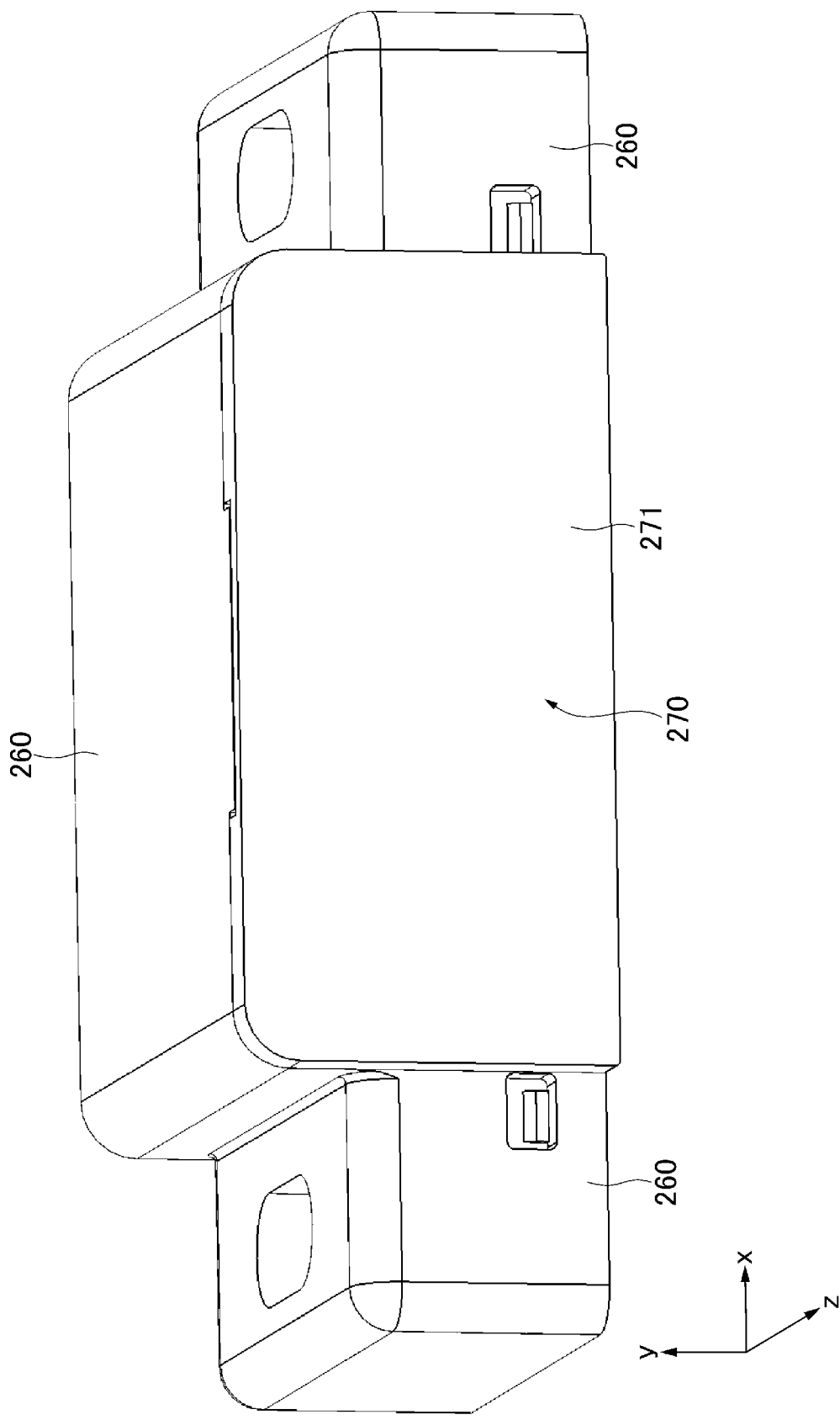
FIG. 7 is a rear perspective view showing an example of the actuator.
Figure 8:
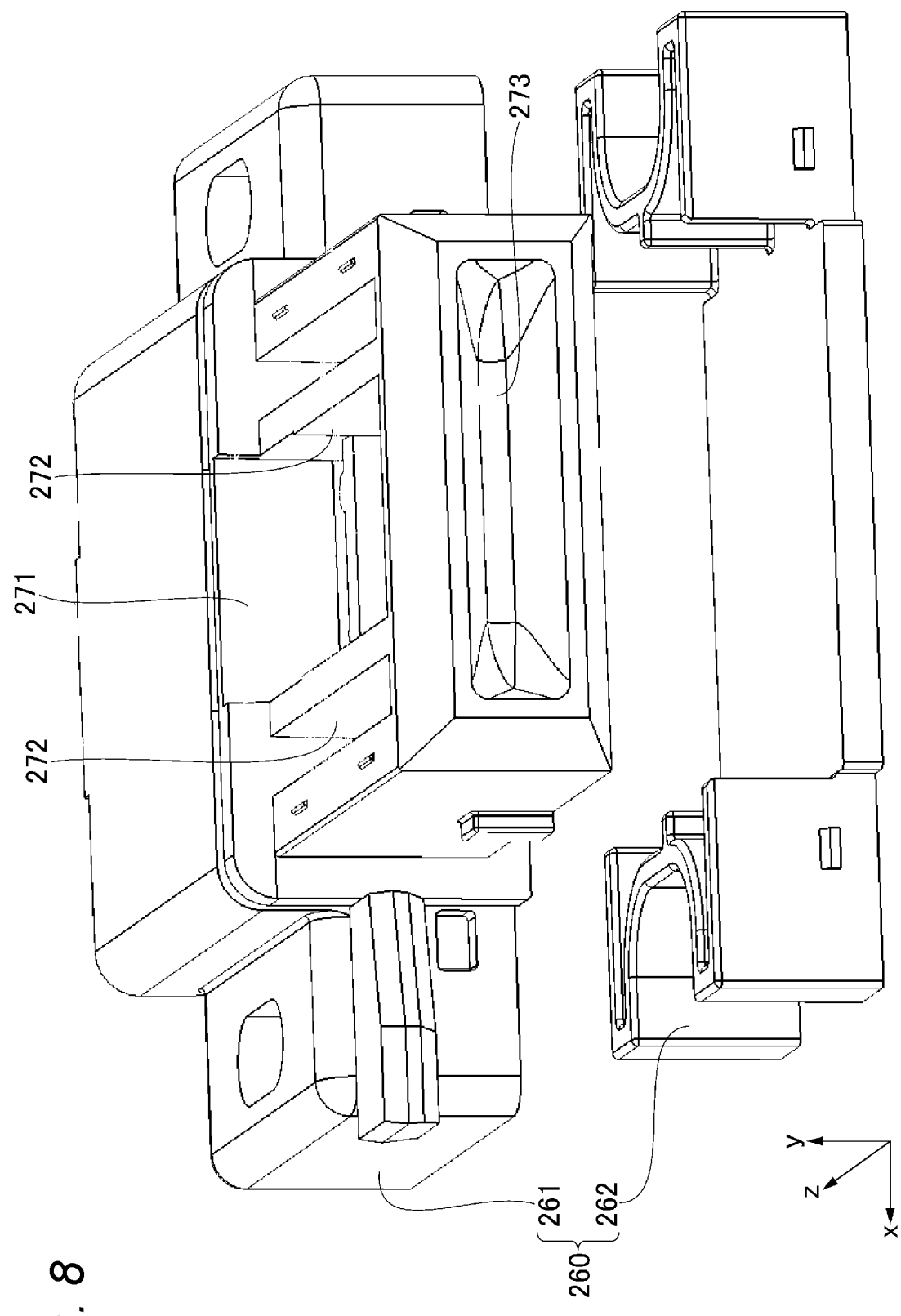
FIG. 8 is an exploded perspective view showing an example of the actuator.
Figure 9:
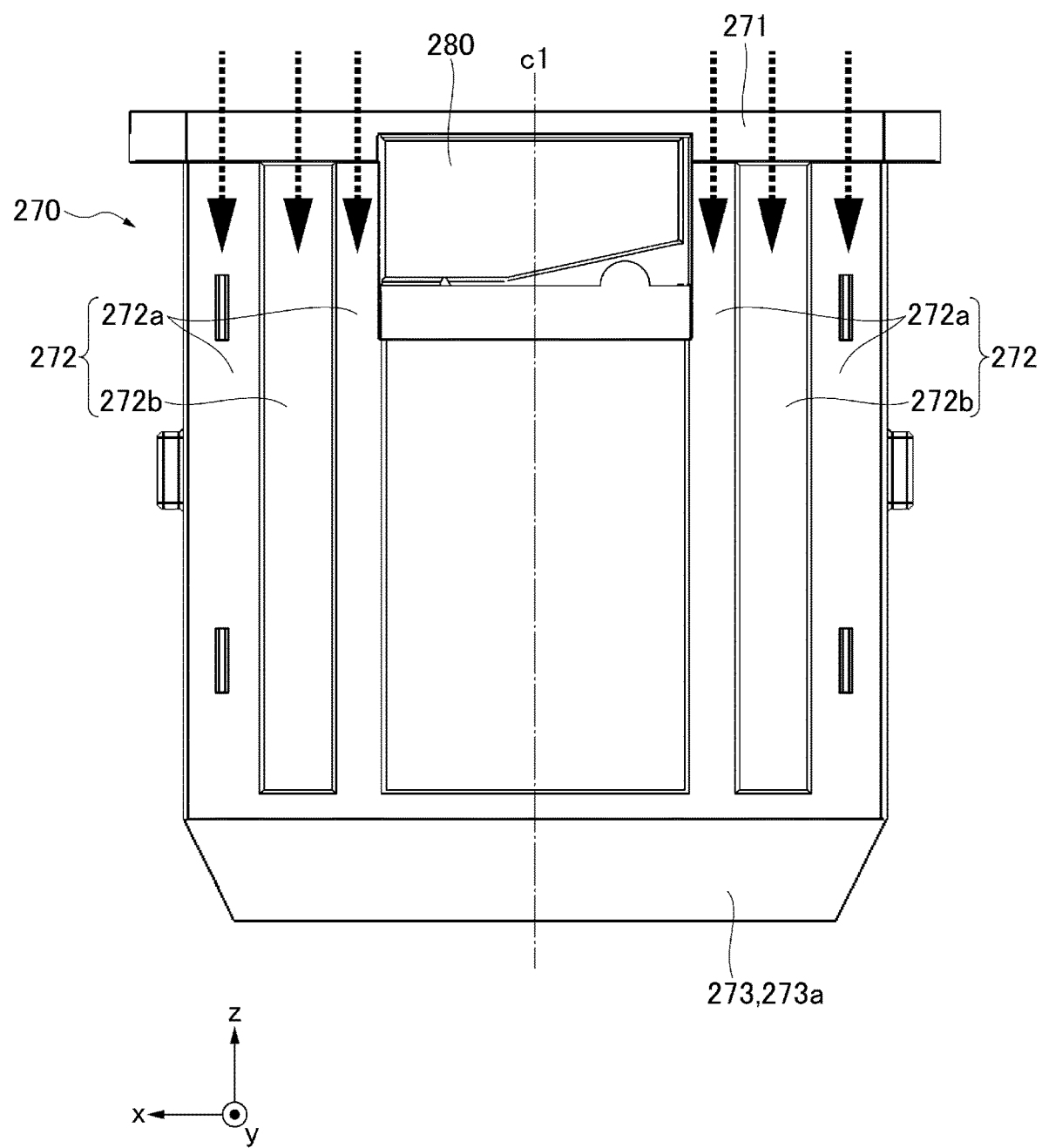
FIG. 9 is a diagram showing an example of a light transmissive member of the actuator.

FIG. 6 is a front perspective view (perspective view seen from the positive side in the z direction) showing an example of the actuator 250. FIG. 7 is a rear perspective view (perspective view seen from the negative side in the z direction) showing an example of the actuator 250. FIG. 8 is an exploded perspective view showing an example of the actuator 250. FIG. 9 is a view of a light transmissive member 270 of the actuator 250 as viewed from a light guiding unit 272 side (the positive side in the y direction).

The actuator 250 includes a housing 260, the light transmissive member 270, and a radio frequency identifier (RFID) tag 280. The light transmissive member 270 includes a light receiving unit 271, a light guiding unit 272, and a light emitting unit 273. The light transmissive member 270 may be formed of, for example, transparent plastic or glass. The light transmissive member 270 receives the light from the sensor main body 210 and emits the visible light.

When door 100 is in the closed state, the light receiving unit 271 faces the first light projection port 214 of the sensor main body 210. The light receiving unit 271 receives the light from the first light projection port 214 of the sensor main body 210 and introduces the light into the actuator 250. The light receiving unit 271 protrudes toward the sensor main body 210 from a surface of the housing 260 facing the sensor main body 210. In this case, the light receiving unit 271 easily takes in the light from the sensor main body 210 into the light transmissive member 270.

The light guiding unit 272 guides the light from the sensor main body 210 from the light receiving unit 271 toward the light emitting unit 273. The light guiding unit 272 may have a linear light guide path as shown in FIG. 9, or may have a light guide path of another shape. A plurality of light guiding units 272 may be provided. When there are a plurality of light guiding units 272, the light guiding units 272 may be provided to be separated from each other by a predetermined distance.

The light guiding unit 272 includes first portions 272a formed by a part of the light transmissive member 270, and a second portion 272b as a space in which the light transmissive member 270 is absent. In FIG. 9, two light guiding units 272 are provided, and in each of the light guiding units 272, the second portion 272b is formed between two first portions 272a. Both the first portions 272a and the second portion 272b contribute to light guiding from the light receiving unit 271 to the light emitting unit 273.

The light emitting unit 273 emits light based on the light guided through the light guiding unit 272. The light emitting unit 273 displays the detection result of the abnormality of the door 100 by the light emission. For example, the light emitting unit 273 emits the light guided through the light guiding unit 272 to the outside. The light emitting unit 273 is capable of transmitting, reflecting, diffusing the light. The light emitting unit 273 has an outer peripheral surface 273a and an inner peripheral surface 273b. The outer peripheral surface 273a is located outside the inner peripheral surface 273b. Both the outer peripheral surface 273a and the inner peripheral surface 273b face the outside of the actuator on a non-facing side (negative side in the z direction) which does not face the sensor main body 210.

The outer peripheral surface 273a is reduced in diameter from the facing side (the positive side in the z direction) facing the sensor main body 210 toward the non-facing side (the negative side in the z direction) not facing the sensor main body 210. Accordingly, the outer peripheral surface 273a can spread and diffuse the light guided through the light guiding unit 272 by refraction or the like. Therefore, the checker can easily see the light of the actuator 250 from various angles.

The inner peripheral surface 273b increases in diameter from the facing side (the positive side in the z direction) facing the sensor main body 210 toward the non-facing side (the negative side in the z direction) not facing the sensor main body 210. Accordingly, the inner peripheral surface 273b easily diffuses the light guided through the light guiding unit 272 in a direction of a center line c1 of the actuator 250 (see FIG. 9) due to refraction or the like.

Therefore, an intensity of the collected light is improved, and the light can be transmitted by a long distance in a center line direction of the actuator 250. Therefore, the checker can easily see the light of the actuator 250.

Figure 10:
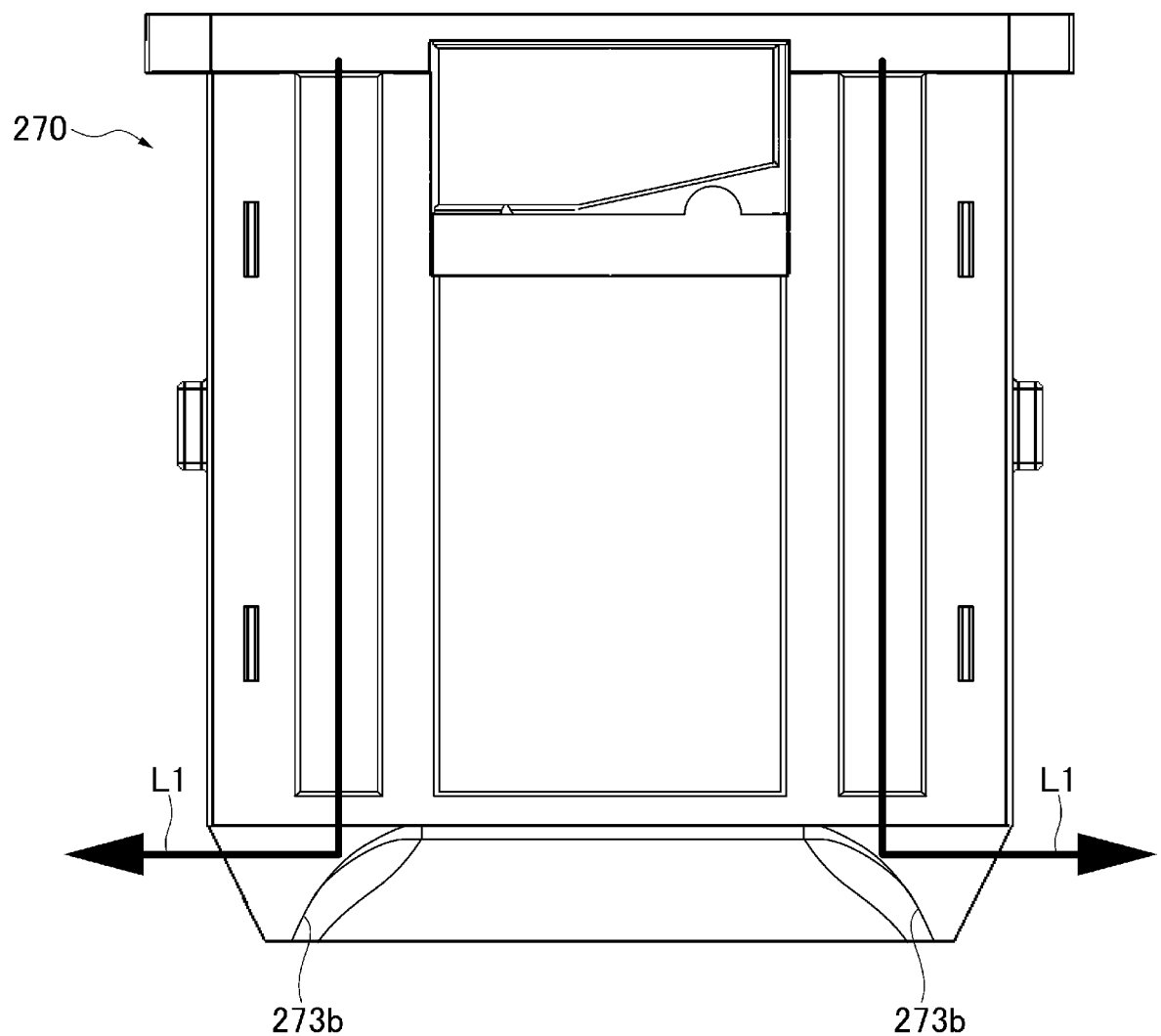
FIG. 10 is a diagram showing an example of reflection of light in a light emitting unit of the light transmissive member of the actuator.

Further, the light emitting unit 273 may have optical transparency, optical reflectivity, or both optical transparency and optical reflectivity. In a case of having both optical transparency and optical reflectivity, a part of the light may be transmitted and the other part of the light may be reflected. FIG. 10 is a diagram showing an example of reflection of the light in the light emitting unit 273. In FIG. 10, the light traveling through the light guiding unit 272 is reflected by the inner peripheral surface 273*b*, and a traveling direction of the light is changed to a direction of L1. It should be noted that it is sufficient that the light emitting unit 273 at least be capable of emitting the light to the outside, and shapes of the outer peripheral surface 273*a* and the inner peripheral surface 273*b* are not limited to the above.

Further, the light emitting unit 273 may protrude to the outside from an end surface of the housing 260 on a side (the negative side in the z direction) opposite to an end surface facing the sensor main body 210. Accordingly, the light emitted from the light emitting unit 273 is more easily diffused.

The RFID tag 280 is arranged in a range in which the RFID tag 280 can communicate with the coil 212 of the sensor main body 210 when the door 100 is in the closed state. The RFID tag 280 is disposed, for example, on the light receiving unit 271 side of the light transmissive member 270. The RFID tag 280 may be disposed between the two light guiding units 272 of the light transmissive member 270. The RFID tag 280 transmits a predetermined signal. The RFID tag 280 is, for example, a passive tag, and operates by receiving power supply from the outside. For example, the RFID tag 280 receives the power supply from the sensor main body 210 via the coil 212, and transmits the predetermined signal to the sensor main body 210. It should be noted that the predetermined signal includes at least ID information.

The housing 260 protects an inside of the actuator 250. The housing 260 includes a first housing 261 and a second housing 262. The first housing 261 surrounds an upper side (the positive side in the y direction) of the light transmissive member 270, and surrounds a left side and a right side (both sides in the x direction) of the light transmissive member 270 together with the second housing 262. The second housing 262 surrounds a lower side (the negative side in the y direction) of the light transmissive member 270, and surrounds the left side and the right side (both sides in the x direction) of the light transmissive member 270 together with the first housing 261. The housing 260 does not surround the light receiving unit 271 and the light emitting unit 273, and the light can pass through the light receiving unit 271 and the light emitting unit 273. The housing 260 may be formed of a non-light-transmissive member. The non-light-transmissive member may be, for example, a non-translucent plastic or rubber material. Since the housing 260 is formed of the non-light-transmissive member, for example, it is possible to prevent leakage and attenuation of the light from the light guiding unit 272, and it is possible to maintain the light intensity of the light emitted from the light emitting unit 273.

Next, the manufacturing apparatus will be described.

The manufacturing apparatus as the door-equipped apparatus 10 is an apparatus that manufactures various products (for example, electrical, mechanical, and chemical substances). The manufacturing apparatus or the product is not limited, and is, for example, a manufacturing apparatus or a product to be handled in consideration. The manufacturing apparatus may operate according to a state of the safety switch 200. For example, when the closed state of all the doors 100 is detected by the safety switch 200, the manufacturing apparatus may be operable, and when the opening state of at least one door 100 is detected by the safety switch 200, the manufacturing apparatus may be inoperable. Accordingly, the door-equipped apparatus 10 can be maintained in a safe state with respect to the manufacturing apparatus or the product.

Permission or prohibition of the operation of the manufacturing apparatus according to the state of the safety switch 200 may be performed by a programmable logic controller (PLC). The PLC is connected between the safety switch 200 and the manufacturing apparatus main body. A processor of the PLC may permit the operation of the manufacturing apparatus when the closed state of all the doors 100 is detected by the safety switch 200, and may prohibit the operation of the manufacturing apparatus when the opening state of at least one door 100 is detected by the safety switch 200.

Next, opening and closing detection of the door 100 and display of an opening and closing detection result will be described.

Figure 11A:
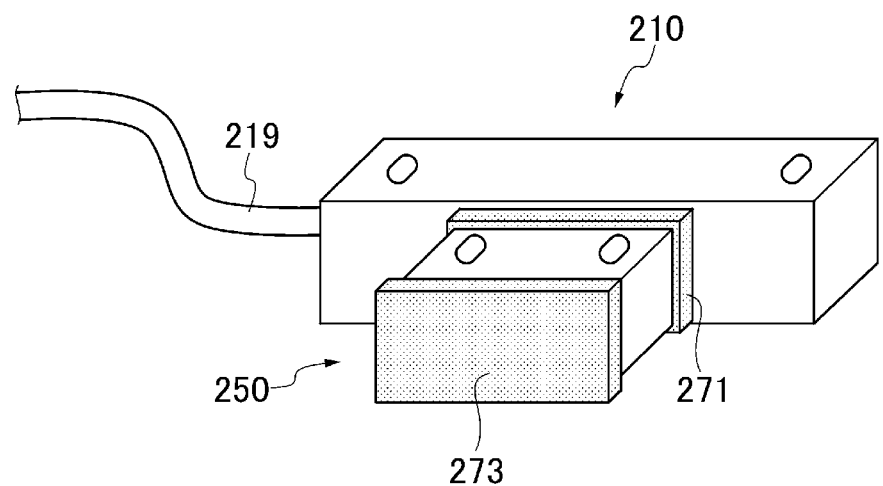
FIG. 11A is a diagram showing closing detection of the door and display of a closing detection result.
Figure 11B:
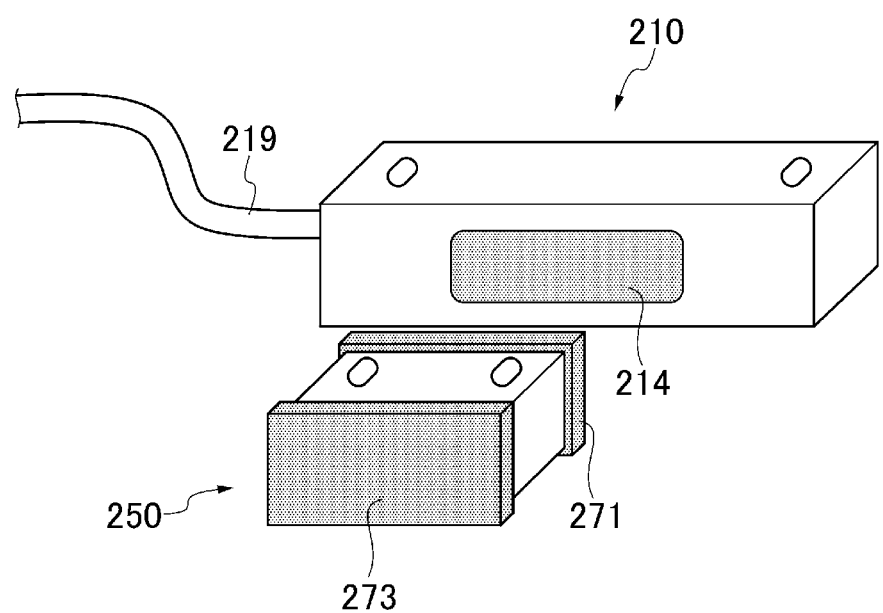
FIG. 11B is a diagram showing opening detection of the door and display of an opening detection result.

FIGS. 11A and 11B are diagrams showing the opening and closing detection of the door 100 and the display of the opening and closing detection result. FIG. 11A shows the closing detection of the door 100 and the display of the closing detection result. FIG. 11B shows the opening detection of the door 100 and the display of the opening detection result.

When the actuator 250 is disposed at a predetermined position with respect to the sensor main body 210, the sensor main body 210 detects the actuator 250. Specifically, when the RFID tag 280 of the actuator 250 is located in a range in which the wireless power transmission from the coil 212 of the sensor main body 210 is possible, the sensor main body 210 supplies the power to the actuator 250, and the actuator 250 transmits the predetermined signal to the sensor main body 210. Upon detecting that the coil 212 receives the predetermined signal from the actuator 250, the coil 212 detects the actuator 250 and notifies the processor 211. Upon receiving this notification, the processor 211 recognizes the actuator 250.

When the sensor main body 210 detects the actuator 250, the processor 211 determines that the movable frame 112 on which the actuator 250 is provided faces the fixed frame 111 on which the sensor main body 210 is provided in a predetermined state, and the door 100 is in the closed state. When the sensor main body 210 does not detect the actuator 250, it is determined that the movable frame 112 on which the actuator 250 is provided does not face the fixed frame 111 on which the sensor main body 210 is provided in the predetermined state, and the door 100 is in the opening state.

When the sensor main body 210 detects the actuator 250, that is, when the door 100 is in the closed state, the first light sources 213 and the second light source 215 are displayed in a first display mode under the control of processor 211. When the sensor main body 210 does not detect the actuator 250, that is, when the door 100 is in the opening state, the first light sources 213 and the second light source 215 are displayed in a second display mode under the control of processor 211. The first display mode and the second display mode are different from each other. For example, the first display mode may be display by projecting green light or blinking, and the second display mode may be display by projecting red light or lighting. The actuator 250 receives the light from the sensor main body 210 and emits the light while maintaining the display mode, thereby displaying the opening and closing detection result of the door 100.

It should be noted that the opening and closing detection of the door 100 may be the detection of the opening and closing state of the door 100 (own door) in which the safety switch 200 (own switch) is provided, or may be the detection of the opening and closed state of another door 100 (another door) in which another safety switch (another switch) other than the safety switch (own switch) is provided instead of the detection of the opening and closing state of the own door. In this case, the first light sources 213 and the second light source 215 may display based on the opening and closing detection result of the own door, or may display based on the opening and closing detection result of another door instead of displaying based on the opening and closing detection result of the own door.

Next, a display example of the opening and closing detection result of the door 100 by the actuator 250 provided in the door 100 will be described.

Figure 12A:
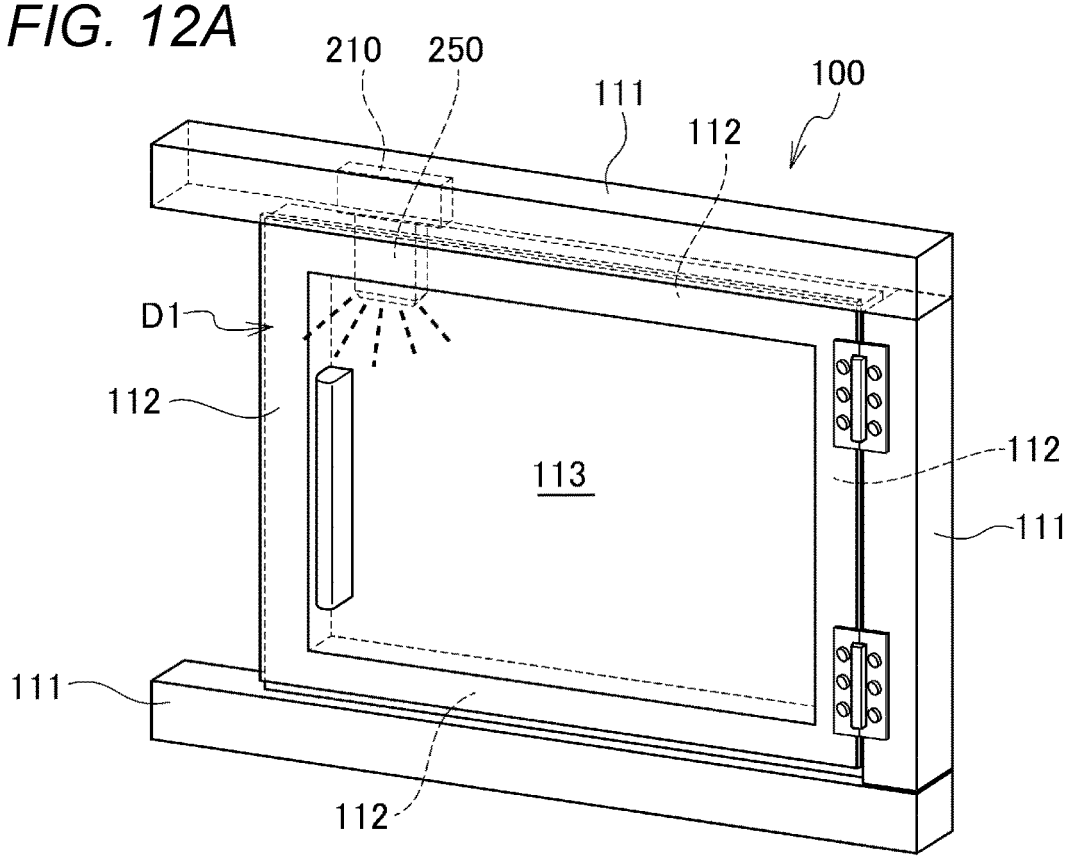
FIG. 12A is a diagram showing a display example of the closing detection result by the safety switch provided in the door.
Figure 12B:
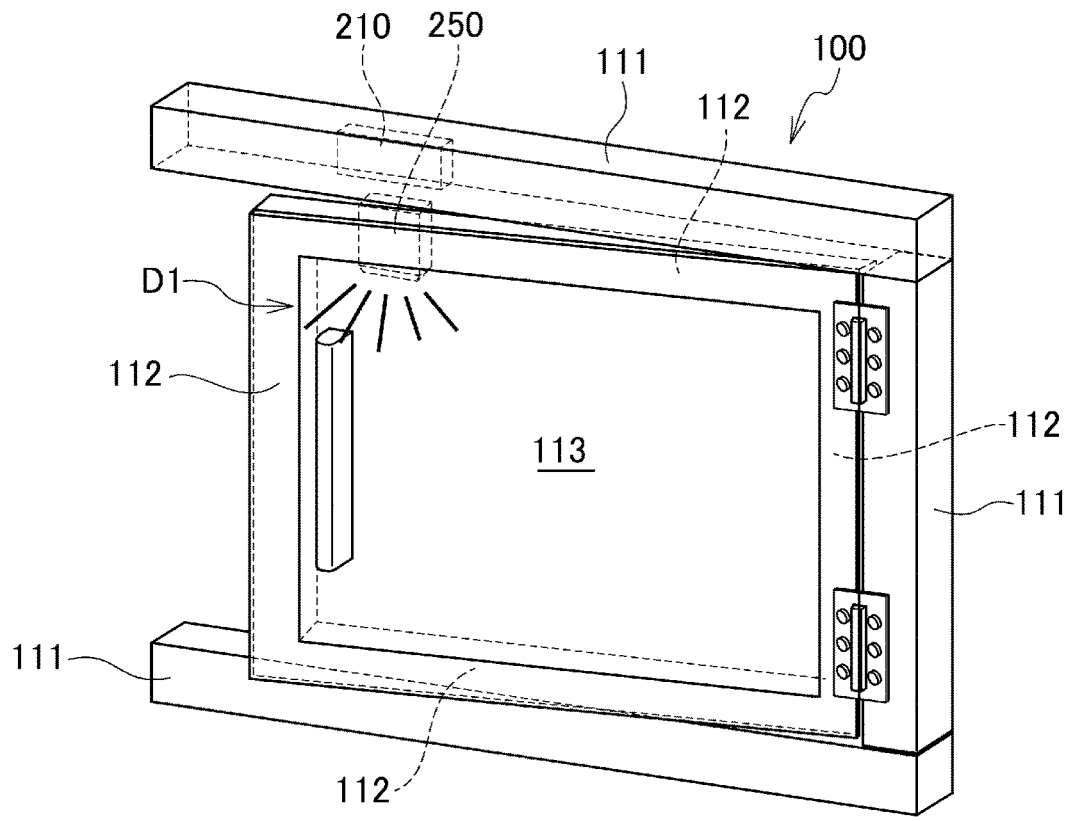
FIG. 12B is a diagram showing a display example of the opening detection result by the safety switch provided in the door.

FIGS. 12A and 12B are diagrams showing the display example of the opening and closing detection result of the door 100 by the actuator 250 provided in the door 100. FIG. 12A shows the display example of the closing detection result. FIG. 12B shows the display example of the opening detection result. Here, a downward direction in a vertical direction is also referred to as "lower", and an upward direction in the vertical direction is also referred to as "upper".

In FIGS. 12A and 12B, the sensor main body 210 is provided on the fixed frame 111 such that the first light projection port 214 of the sensor main body 210 is on the lower side in the vertical direction (the negative side in the z direction in which the actuator 250 is disposed). Further, the actuator 250 is provided on the movable frame 112 such that the light receiving unit 271 of the actuator 250 is on the upper side (the positive side in the z direction in which the sensor main body 210 is disposed) in the vertical direction and the light emitting unit 273 is on the lower side (the negative side in the z direction which is a side opposite to the side on which the sensor main body 210 is disposed) in the vertical direction. In FIGS. 12A and 12B, at least a part of the light emitting unit 273 of the light transmissive member 270 of the actuator 250 protrudes below a lower end portion of the movable frame 112.

As shown in FIG. 12A, when the door 100 is in the closed state, the movable frame 112 is present in the vicinity of the fixed frame 111. Therefore, the light projected by the sensor main body 210 attached to the fixed frame 111 is blocked by the movable frame 112. Therefore, the light projected by the sensor main body 210 cannot be checked from the outside of the door-equipped apparatus 10. However, the actuator 250 can introduce the light projected from the sensor main body 210, and the actuator 250 emits the light. The light emitted from the actuator 250 attached to the movable frame 112 is diffused in the direction of the door main body 113, and can be visually recognized from the outside of the door-equipped apparatus 10 via the light transmissive member as the door main body 113. The display mode when the door 100 is in the closed state may be a display mode D1.

When the door 100 is in the opening state, the movable frame 112 is absent in the vicinity of the fixed frame 111. Therefore, the light projected by the sensor main body 210 attached to the fixed frame 111 can be diffused without being blocked by the movable frame 112. Therefore, even when the actuator 250 does not emit the light, the light projected by the sensor main body 210 can be visually recognized from the outside of the door-equipped apparatus 10. The display mode when the door 100 is in the opening state may be a display mode D2.

Actually, when the sensor main body 210 and the actuator 250 are largely separated from each other in a state in which the door 100 is not in a half-closed state but is largely opened, and the actuator 250 cannot introduce the light projected from the sensor main body 210, the actuator 250 does not emit the light. In this case, the light transmitted through the sensor main body 210 can be visually recognized.

On the other hand, as shown in FIG. 12B, when the door 100 is in the opening state but is not opened so much as in the half-closed state, and the actuator 250 can introduce a part of the light projected from the sensor main body 210, the actuator 250 emits the light. In this case, at least the light emitted by the actuator 250 can be visually recognized, and the light projected by the sensor main body 210 can also be visually recognized.

It should be noted that, here, the safety switch 200 is provided at an upper end portion of the door 100 in the vertical direction, and the present disclosure is not limited thereto. That is, the sensor main body 210 is provided in an upper frame body of the fixed frame 111, the actuator 250 is provided in an upper frame body of the movable frame 112, and the present disclosure is not limited thereto.

For example, the safety switch 200 may be provided at a side end portion of the door 100. That is, the sensor main body 210 may be provided in a frame body of a side portion of the fixed frame 111, and the actuator 250 may be provided in a frame body of a side portion of the movable frame 112. In this case, the sensor main body 210 is provided on the fixed frame 111 such that the first light projection port 214 of the sensor main body 210 faces the actuator 250. Further, the actuator 250 is provided on the movable frame 112 such that the light receiving unit 271 of the actuator 250 faces the sensor main body 210.

Figure 13:
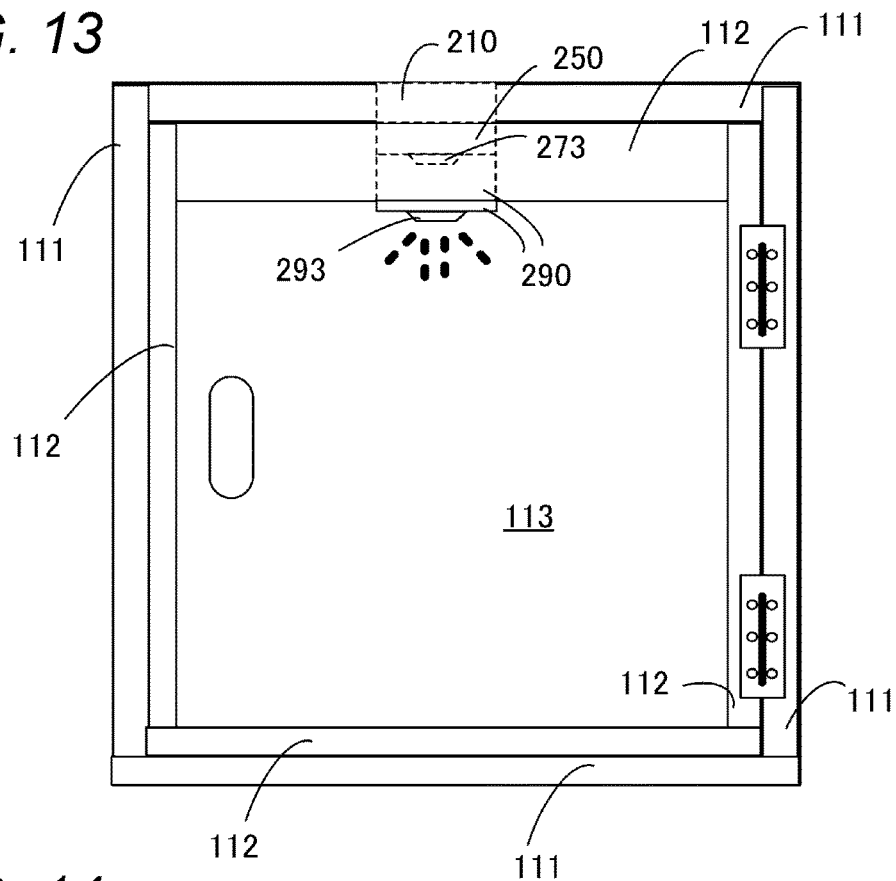
FIG. 13 is a diagram showing an extension option of the actuator.

Next, an extension option of the actuator 250 will be described. FIG. 13 is a diagram showing the extension option of the actuator 250.

For example, when a thickness (for example, a length in the vertical direction) of the fixed frame 111 or the movable frame 112 is large (for example, long), it may be difficult to check the light emitting unit 273 of the light transmissive member 270 of the actuator 250 or the emitted light. In response to this, the actuator 250 may be substantially extended such that a light guiding distance of the actuator 250 becomes long. Specifically, an extension member 290 that is attachable to and detachable from the actuator 250 may be attached to the actuator 250. The extension member 290 guides and emits the light emitted by the actuator 250.

The extension member 290 includes at least a light transmissive member. The extension member 290 may include a component similar to that of the actuator 250, and may include a housing and the light transmissive member. The housing and the light transmissive member of the extension member 290 may have the same shapes as those of the housing 260 and the light transmissive member 270 of the actuator 250. In this case, the extension member 290 is easily formed. A light guiding unit of the light transmissive member of the extension member 290 may be longer than the light guiding unit 272 of the light transmissive member 270 of the actuator 250. In this case, the light guiding distance by the extension member 290 can be increased. Further, a light receiving unit of the light transmissive member of the extension member 290 may be formed so as to be engaged with a shape of a distal end (distal end on the negative side in the z direction) in an emission direction of the light emitting unit 273 of the light transmissive member 270 of the actuator 250. In this case, the actuator 250 and the extension member 290 are easily attached and detached, and are easily integrated. FIG. 13 shows a state in which the light guided through the actuator 250 and the extension member 290 is emitted from a light emitting unit 293 of the light transmissive member of the extension member 290.

In this manner, the extension member 290 can efficiently receive, guide, and emit the light emitted from the actuator 250 to the extension member 290. Therefore, even when it is difficult for the checker who checks the light of the actuator 250 from the outside of the door-equipped apparatus 10 to check the light of the extension member 290, the checker can easily check the light. Therefore, it is easy to check the light based on the light of the actuator regardless of the thickness of the fixed frame 111 or the movable frame 112.

Modification

Figure 14:
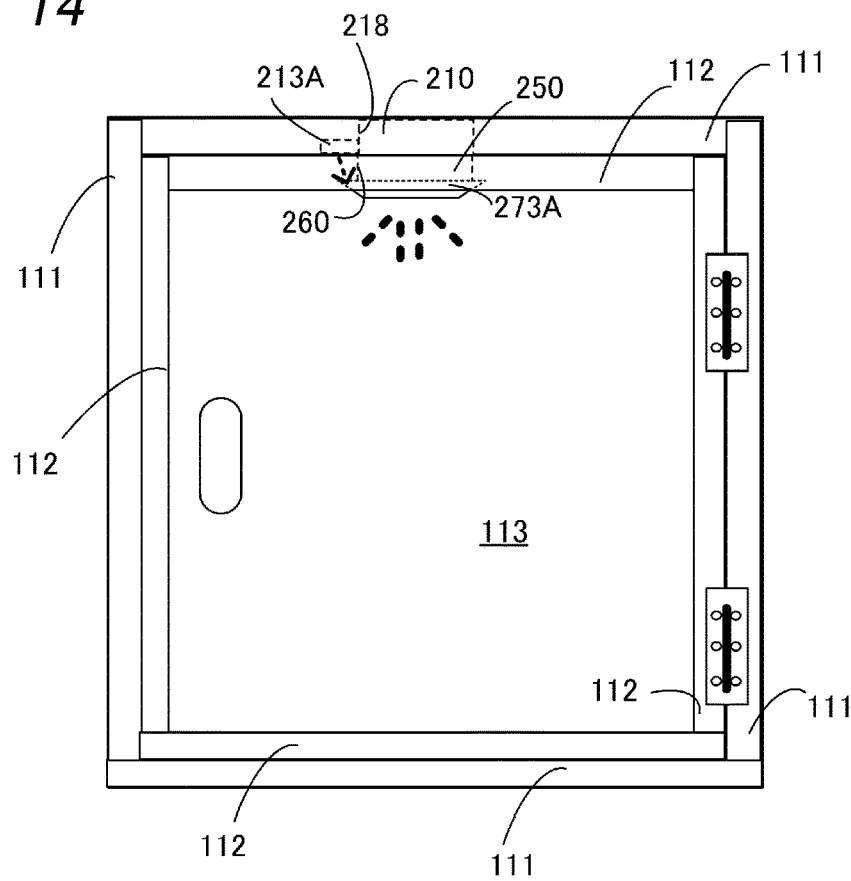
FIG. 14 is a simplified diagram showing a modified configuration example of the safety switch.

FIG. 14 is a schematic diagram showing a modification configuration example of the safety switch 200.

In the safety switch 200, the first light source 213 may not be provided inside the housing 218 of the sensor main body 210, and a first light source 213A may be provided outside the housing 218. In this case, without the light transmissive member 270 inside the housing 260 of the actuator 250, the light may be guided from the outside of the housing 260 toward a side opposite to the sensor main body 210, and the light may be emitted by a light emitting unit 273A emitting light. Even in this case, the actuator 250 can emit the light in accordance with the light from the sensor main body 210. It should be noted that the light emitting unit 273A may not necessarily be a light transmissive member as long as it can emit the light by receiving the light from the sensor main body 210.

It should be noted that, as described above, when the first light sources 213 are provided inside the housing 218 of the sensor main body 210 and the light transmissive member 270 is provided inside the housing 260 of the actuator 250 to emit the light from the sensor main body 210 from the light emitting unit 273, the light can be transmitted inside the actuator 250. Therefore, it is not necessary to provide the first light source 213A outside the housing 218 of the sensor main body 210 so as to pass through the outside of the housing 260 of the actuator 250. Therefore, the sensor main body 210 is reduced in size, and thus the entire safety switch 200 is reduced in size. This is also effective when there is no sufficient space for providing the first light source 213A outside the housing 218 of the sensor main body 210.

As described above, according to the safety switch 200, the sensor main body 210 can project the light from the light projection unit toward the actuator 250 via the first light projecting port 214. The actuator 250 can further emit the light toward the outside of the safety switch 200 based on the light from the sensor main body 210. Therefore, even when the safety switch 200 is disposed on the rear surfaces of the fixed frame 111 and the movable frame 112 and the light of the sensor main body 210 is not seen from the checker, the display of the detection result can be visually recognized from the outside of the door-equipped apparatus 10 via the actuator 250. This is because, for example, the actuator 250 is disposed below the sensor main body 210 in the vertical direction and easily protrudes from the rear surface of the frame. Further, for example, even when there are a large number of doors 100, it is possible to easily grasp which door 100 is abnormal (for example, the door 100 is opened) by checking the light of the actuator 250.

Although the door 100 is originally advantageous in displaying the opening state as the abnormality, the door 100 is also advantageous in displaying that the door 100 is in the closed state (safe state) as follows.

When the door 100 is closed, for example, when the display indicating the closed state of the door 100 is not performed (turned off), the checker cannot grasp whether the display is not performed because the door 100 is closed or the display is not performed because the safety switch 200 is in failure. When the display is not performed due to the failure, if the checker does not immediately know that the display is not performed due to the failure, the checker recognizes that the safety switch 200 is in failure, which means the safety switch does not function. Therefore, even when the door 100 is in the closed state, the display indicating that the door 100 is in the closed state is performed, and the display is visually recognized by the checker, whereby it is possible to maintain a state in which it is possible to confirm that the function of the safety switch is performed. As described above, even when the door 100 is in the closed state, the safety switch 200 can notify the checker that the door 100 is in the closed state in distinction from the failure because the display thereof can be visually recognized from a wider range.

Although various embodiments have been described above with reference to the drawings, it is needless to say that the present invention is not limited thereto. It will be apparent to those skilled in the art that various changes and modifications can be conceived within the scope of the claims, and it is also understood that the various changes and modifications belong to the technical scope of the invention. In addition, the respective components in the above-described embodiments may be optionally combined within a range not departing from the scope of the present invention.

The above-described embodiment describes that in the door-equipped apparatus 10, the manufacturing apparatus main body is surrounded by the doors 100, and the present disclosure is not limited thereto. For example, lockers (for example, delivery lockers) may be disposed instead of the manufacturing apparatus main body. Further, the doors 100 may simply surround a predetermined space. That is, the door-equipped apparatus 10 may simply partition the space.

In the above embodiment, in FIG. 1, the plurality of doors 100 are provided so as to surround the manufacturing apparatus main body, the door-equipped apparatus 10 is formed in a rectangular shape in a plan view, and the present disclosure is not limited thereto. For example, the plurality of doors 100 may be arranged in one direction, and the door-equipped apparatus 10 may be formed in a linear shape.

In the above-described embodiment, shapes of the light emitting units 273 and 293 may have, for example, a prism shape, a wave shape, a spherical shape, or a planar shape. The light emitting units 273 and 293 may be formed of frosted glass or the like.

In the above embodiment, the processor may be physically configured in any manner. When a programmable processor is used, processing contents can be changed by changing a program, and thus a degree of freedom in designing the processor can be increased. The processor may be configured with one semiconductor chip, or may be physically configured with a plurality of semiconductor chips. When the processor is configured with a plurality of semiconductor chips, controls in the embodiment described above may be respectively implemented by different semiconductor chips. In this case, it can be considered that one processor is configured with the plurality of semiconductor chips. The processor may be configured with a semiconductor chip and a member (such as a capacitor) having a different function. One semiconductor chip may be configured to implement a function of the processor and another function. A plurality of processors may be implemented by one processor.

As described above, in the above embodiment, the safety switch 200 includes the sensor main body 210 and the actuator 250. When the actuator 250 is disposed at a predetermined position with respect to sensor main body 210, the sensor main body 210 includes the detection unit (for example, the coil 212) that detects the actuator 250 and the light projection unit (for example, the first light sources 213) that projects the light according to the detection result of the detection unit. The actuator 250 includes the light emitting units 273 and 273A that emit the visible light in response to reception of the light projected by the light projection unit.

Accordingly, in the safety switch 200, the sensor main body 210 can project the light from the light projection unit toward the actuator 250. The actuator 250 can further emit the light toward the outside of the safety switch 200 based on the light from the sensor main body 210. Therefore, even when the safety switch 200 is disposed on the rear surfaces of the fixed frame 111 and the movable frame 112, the checker can visually recognize the display of the detection result by the safety switch 200 from the front surface of the door 100 (the outside of the door-equipped apparatus 10) via the actuator 250. Therefore, the safety switch 200 can improve the visibility of the display of the detection result of the abnormality detected by the safety switch 200.

Since the actuator 250 emits the light based on the light from the sensor main body 210, a light source is not necessary on the actuator 250 side, and thus it is not necessary to connect a power supply line to the actuator 250. Therefore, even when the actuator 250 is attached to the movable frame 112, the actuator 250 can be easily provided.

The light projection unit may project the light through the facing surface (for example, a surface of the first light projection port 214) facing the actuator 250.

Accordingly, the safety switch 200 can expand the region of the light of the light projection source by the light projection unit projecting the light via the facing surface facing the actuator. For example, instead of providing the light source outside the housing 218 of the sensor main body 210, the plurality of first light sources 213 are arranged so as to correspond to the facing surface, and thus it is possible to expand the region of the light of the light projection source. Further, since the light projection unit projects the light via the facing surface of the actuator, the light from the sensor main body 210 can be transmitted to the actuator 250 with high efficiency, and display efficiency is improved. Therefore, the visibility of the safety switch 200 is improved.

Further, the light projection unit may project the visible light. The light emitting unit 273 may be formed of the light transmissive member 270.

Accordingly, the actuator 250 can emit the light with the simple configuration. Since the light is transmitted by the light transmissive member 270 of the actuator 250, for example, it is not necessary to provide a configuration for guiding the light from the sensor main body 210 outside the housing 260 of the actuator 250, which leads to miniaturization of the actuator 250.

The light emitting unit 273 may have the outer peripheral surface 273a and the inner peripheral surface 273b. The outer peripheral surface 273a, on the outer side of the inner peripheral surface 273b, may face the outside of the actuator on the non-facing side that is a side opposite to the sensor main body 210. The inner peripheral surface 273b, on the inner side of the outer peripheral surface 273a, may face the outside of the actuator on the non-facing side. The diameter of the outer peripheral surface 273a may be reduced from the facing side facing the sensor main body 210 toward the non-facing side.

Accordingly, when the actuator 250 receives the light from the sensor main body 210 and emits the light toward the side opposite to the sensor main body 210, the actuator 250 can expand and diffuse the range in the direction in which the light travels due to refraction or the like on the outer peripheral surface 273a. Therefore, the range in which the light emitted from the actuator 250 can be visually recognized is widened, and the checker can easily see the light of the actuator 250 from various angles.

The light emitting unit 273 may have the outer peripheral surface 273a and the inner peripheral surface 273b. The outer peripheral surface 273a, on the outer side of the inner peripheral surface 273b, may face the outside of the actuator on the non-facing side that is a side opposite to the sensor main body 210. The inner peripheral surface 273b, on the inner side of the outer peripheral surface 273a, may face the outside of the actuator on the non-facing side. The diameter of the inner peripheral surface 273b may increase from the facing side facing the sensor main body 210 toward the non-facing side.

Accordingly, when the actuator 250 receives the light from the sensor main body 210 and emits the light toward the side opposite to the sensor main body 210, the light is easily diffused in the direction of the center line c1 of the actuator 250 due to the refraction or the like on the inner peripheral surface 273b. Therefore, the intensity of the diffused light is improved, and the diffused light can be transmitted by a long distance in the direction of the center line c1 of the actuator 250. Therefore, the checker can easily see the light of the actuator 250.

The actuator 250 may include the light guiding unit 272 which is formed of the light transmissive member 270 and guides the light from the sensor main body 210 to the light emitting unit 273, and the non-light-transmissive member (for example, the housing 260) which surrounds the outer periphery of the light guiding unit 272.

Accordingly, the actuator 250 can prevent leakage of the light from the light projection unit to the outside of the actuator through the light transmissive member 270 inside the actuator. Therefore, the actuator 250 can prevent the attenuation of the light emitted by the light emitting unit 273, and can improve the visibility of the light of the actuator.

The light projection unit may include a plurality of display lamps. The actuator 250 may include the wireless transmission unit (for example, the RFID tag 280) that faces the sensor main body 210 and transmits the predetermined signal. The detection unit may be disposed to face the wireless transmission unit and receive the predetermined signal. In the sensor main body 210, the plurality of display lamps may be disposed at symmetrical positions with respect to the detection unit.

Accordingly, in the sensor main body 210, since the plurality of display lamps are disposed at the symmetrical positions with respect to the detection unit, the light projected by the light projection unit can be uniformly transmitted to the actuator 250. Therefore, the actuator 250 can uniformly emit the light and can symmetrically emit the light to the outside of the actuator. Therefore, the checker can easily see the light emitted from the actuator 250.

The light emitting unit 273 may include a reflection surface (for example, the inner peripheral surface 273b) on which the light from the light projection unit is reflected in a direction (for example, the x direction) perpendicular to the arrangement direction (for example, the z direction) of the sensor main body 210 and the actuator 250, and an emission surface (for example, the outer peripheral surface 273a) on which the light reflected by the reflection surface is emitted to the outside of the actuator.

Accordingly, the actuator 250 can change the traveling direction of the light from the sensor main body 210 using the reflection, and can diffuse the light in a wider range. Therefore, the checker can visually recognize the light from a wider range.

The end portion of the light emitting unit 273 on a side opposite to the sensor main body 210 may protrude from an end portion of the non-light-transmissive member on a side opposite to the sensor main body 210.

Accordingly, since the light emitting unit 273 is present so as to protrude from the non-light-transmissive member (for example, the housing 260), for example, even when the actuator is disposed on the rear surface of the movable frame 112, the checker can easily see the door 100 from the front side.

The safety switch 200 may further include the extension member 290 attachable to and detachable from the actuator 250. The extension member 290 may guide and emit the light emitted by the actuator 250.

Accordingly, the extension member 290 can extend a transmission distance of the light emitted by the actuator 250. Therefore, for example, even when the actuator 250 is provided on the movable frame 112 which is long along the arrangement direction (z direction) of the actuator 250 and the sensor main body 210, or when the sensor main body 210 is provided on the fixed frame 111 which is long in this direction, it is easy for the checker to visually recognize the light emitted by the actuator 250.

The door-equipped apparatus 10 according to the embodiment includes the door 100 and the safety switch 200. The door 100 includes the fixed frame 111, the movable frame 112, and the door main body 113. The sensor main body 210 of the safety switch 200 is provided on the fixed frame 111. The actuator 250 of the safety switch 200 is provided on the movable frame 112.

Accordingly, even when the sensor main body 210 and the actuator 250 are disposed on the rear surfaces of the fixed frame 111 and the movable frame 112, the door-equipped apparatus 10 can cause the display of the detection result by the safety switch 200 to be visually recognized from the front surface of the door 100 (the outside of the door-equipped apparatus 10) via the actuator 250. Therefore, the door-equipped apparatus 10 can improve the visibility of the display of the detection result of the abnormality detected by the safety switch 200.

Further, at least a part of the light emitting unit 273 of the actuator 250 may be disposed so as to protrude from the end portion of the movable frame 112 on the side opposite to the fixed frame 111.

Accordingly, even when the actuator 250 is disposed on the rear surface of the movable frame 112, the door-equipped apparatus 10 can reliably check a light emitting position in the actuator 250 from the front surface side of the door-equipped apparatus 10.

Although the present disclosure has been described in detail with reference to the specific embodiment, it will be apparent to those skilled in the art that various changes and modifications can be made without departing from the spirit and scope of the present disclosure.

The present disclosure is based on Japanese Patent Application (Application No. 2020-010407) filed on Jan. 24, 2020, and the contents thereof are incorporated herein as reference.

INDUSTRIAL APPLICABILITY

The present disclosure is useful for a safety switch, an apparatus with a door, and the like capable of improving visibility of a display of a detection result of abnormality detected by the safety switch.

REFERENCE SIGNS LIST 10 door-equipped apparatus
100 door
111 fixed frame
112 movable frame
113 door main body
200 safety switch
210 sensor main body
211 processor
212 coil
213 first light source
214 first light projection port
215 second light source
216 second light projection port
217 substrate
218 housing
219 cable
250 actuator
260 housing
261 first housing
262 second housing
270 light transmissive member
271 light receiving unit
272 light guiding unit
273 light emitting unit
273a outer peripheral surface
273b inner peripheral surface
280 RFID tag
290 extension member
293 light emitting unit

What is claimed is:
1. A safety switch comprising:
a sensor main body; and
an actuator,
wherein the sensor main body comprises:
a detection unit configured to detect the actuator when the actuator is disposed at a predetermined position with respect to the sensor main body; and
a light projection unit configured to project light in accordance with a detection result of the detection unit, and wherein the actuator comprises:
  a light emitting unit configured to emit visible light in response to reception of the light projected by the light projection unit,
wherein the light emitting unit is formed of a light transmissive member, and
wherein the actuator comprises a light guiding unit formed of the light transmissive member and configured to guide the light from the sensor main body to the light emitting unit.

2. The safety switch according to claim 1,
wherein the light projection unit projects the light through a facing surface that faces the actuator.

3. The safety switch according to claim 1,
wherein the light projection unit projects the visible light.

4. The safety switch according to claim 1,
wherein the light emitting unit has an outer peripheral surface and an inner peripheral surface,
wherein the outer peripheral surface faces, on an outer side of the inner peripheral surface, an outside of the actuator on a non-facing side that is a side opposite to the sensor main body,
wherein the inner peripheral surface, on an inner side of the outer peripheral surface, faces the outside of the actuator on the non-facing side, and
wherein a diameter of the outer peripheral surface is reduced from a facing side facing the sensor main body toward the non-facing side.

5. The safety switch according to claim 1,
wherein the light emitting unit has an outer peripheral surface and an inner peripheral surface,
wherein the outer peripheral surface, on an outer side of the inner peripheral surface, faces an outside of the actuator on a non-facing side that is a side opposite to the sensor main body,
wherein the inner peripheral surface, on an inner side of the outer peripheral surface, faces the outside of the actuator on the non-facing side, and
wherein a diameter of the inner peripheral surface increases from the facing side facing the sensor main body toward the non-facing side.

6. The safety switch according to claim 1,
wherein the light projection unit comprises a plurality of display lamps,
wherein the actuator comprises a wireless transmission unit facing the sensor main body and configured to transmit a predetermined signal,
wherein the detection unit is disposed to face the wireless transmission unit and receives the predetermined signal, and
wherein the plurality of display lamps are disposed in the sensor main body at symmetrical positions with respect to the detection unit.

7. The safety switch according to claim 1,
wherein the light emitting unit comprises:
  a reflection surface on which the light from the light projection unit is reflected in a direction perpendicular to an arrangement direction of the sensor main body and the actuator, and
  an emission surface on which the light reflected by the reflection surface is emitted to the outside of the actuator.

8. The safety switch according to claim 1, further comprising:
an extension member attachable to and detachable from the actuator,
wherein the extension member is configured to guide and emit the light emitted by the actuator.

9. The safety switch according to claim 1,
wherein the actuator comprises:
  a non-light-transmissive member surrounding an outer periphery of the light guiding unit.

10. The safety switch according to claim 9,
wherein an end portion of the light emitting unit on a side opposite to the sensor main body protrudes from an end portion of the non-light-transmissive member on the side opposite to the sensor main body.

11. An apparatus with a door comprising:
the safety switch according to claim 1; and
a door,
wherein the door comprises a fixed frame, a movable frame, and a door main body,
wherein the sensor main body of the safety switch is provided on the fixed frame, and
wherein the actuator of the safety switch is provided on the movable frame.

12. The apparatus with a door according to claim 11,
wherein at least a part of the light emitting unit of the actuator is disposed to protrude from an end portion of the movable frame on a side opposite to the fixed frame.

* * * * *